(12) United States Patent
Radovanov et al.

(10) Patent No.: US 9,288,889 B2
(45) Date of Patent: Mar. 15, 2016

(54) APPARATUS AND TECHNIQUES FOR ENERGETIC NEUTRAL BEAM PROCESSING

(71) Applicant: Varian Semiconductor Equipment Associates, Inc., Gloucester, MA (US)

(72) Inventors: Svetlana B. Radovanov, Brookline, MA (US); Bon-Woong Koo, Andover, MA (US); Peter F. Kurunczi, Cambridge, MA (US); Ludovic Godet, Boston, MA (US)

(73) Assignee: Varian Semiconductor Equipment Associates, Inc., Glouchester, MA (US)

( * ) Notice: Subject to any disclaimer, the term of this patent is extended or adjusted under 35 U.S.C. 154(b) by 472 days.

(21) Appl. No.: 13/798,829

(22) Filed: Mar. 13, 2013

(65) Prior Publication Data
US 2014/0272179 A1   Sep. 18, 2014

(51) Int. Cl.
*H05H 3/02* (2006.01)
*H01J 37/32* (2006.01)
*H01J 37/317* (2006.01)

(52) U.S. Cl.
CPC ............ *H05H 3/02* (2013.01); *H01J 37/3171* (2013.01); *H01J 37/32357* (2013.01); *H01J 37/32422* (2013.01); *H01J 2237/0041* (2013.01); *H01J 2237/024* (2013.01)

(58) Field of Classification Search
CPC ....................................................... H05H 3/02
USPC ....................................................... 250/251
See application file for complete search history.

(56) References Cited

U.S. PATENT DOCUMENTS

| | | | | |
|---|---|---|---|---|
| 4,935,623 A | * | 6/1990 | Knauer | H05H 3/02 118/715 |
| 5,739,528 A | * | 4/1998 | Kato | H01J 27/028 250/251 |
| 5,776,253 A | * | 7/1998 | Asakawa | C23C 16/48 117/103 |
| 6,909,086 B2 | | 6/2005 | Samukawa et al. | |
| 7,638,759 B2 | | 12/2009 | Economou et al. | |
| 7,767,977 B1 | | 8/2010 | Godet et al. | |
| 7,789,992 B2 | | 9/2010 | Lee | |
| 7,919,142 B2 | | 4/2011 | Yeom et al. | |
| 8,101,510 B2 | | 1/2012 | Godet et al. | |
| 2004/0016876 A1 | | 1/2004 | Yeom et al. | |
| 2007/0221833 A1 | | 9/2007 | Yeom et al. | |
| 2009/0289179 A1 | | 11/2009 | Chen et al. | |

OTHER PUBLICATIONS

Radovanov, Svetlana, et al., Plasma Potential Modulated Ion Implantation System, U.S. Appl. No. 13/457,451, filed Apr. 26, 2012.

(Continued)

*Primary Examiner* — Jack Berman

(57) ABSTRACT

A processing system includes a plasma source chamber to generate a plasma; an extraction assembly adjacent the plasma source chamber having an extraction plate and a beam modifier, the extraction plate defining an extraction plate plane and an aperture to extract ions from the plasma source chamber into an ion beam, the beam modifier adjacent to the extraction plate and operative to adjust an ion beam trajectory angle of the ion beam with respect to a perpendicular to the extraction plate plane; and a neutralizer to receive the ion beam extracted by the extraction assembly, convert the ion beam to a neutral beam and direct the neutral beam towards a substrate, the neutralizer having one or more neutralizer plates arranged at a neutralizer plate angle, the extraction assembly and the neutralizer interoperative to provide an ion beam incident angle of the ion beam with respect to the neutralizer plates.

19 Claims, 9 Drawing Sheets

(56) References Cited

OTHER PUBLICATIONS

Samukawa, Seiji, et al., Generating High-Efficiency Neutral Beams by Using Negative Ions in an Inductively Coupled Plasma Source, Journal of Vacuum Science Technology, Sep./Oct. 2002, pp. 1566-1573, A 20(5), American Vacuum Society.

Endo, Kazuhiko, et al., Damage-Free Neutral Beam Etching Technology for High Mobility FinFETs, IEEE Conference, 2005, pp. 1-4, IEEE.

Endo, Kazuhiko, et al., Fabrication of FinFETs by Damage-Free Neutral-Beam Etching Technology, IEEE Transactions on Electron Devices, Aug. 2006, pp. 1826-1833, vol. 53, No. 8, IEEE.

Nam, Sang Ki, et al., Generation of Fast Neutral Beams by Ion Neutralization in High-Aspect-Ratio Holes: A Particle-in-Cell Simulation Study, IEEE Transactions on Plasma Science, Oct. 2007, pp. 1370-1378, vol. 35, No. 5, IEEE.

Park, B.J., et al., Low Angle Forward Reflected Neutral Beam Source and its Applications, Journal of Physics D: Applied Physics, Jan. 4, 2008, pp. 1-13, vol. 41, IOP Publishing.

\* cited by examiner

APPARATUS AND TECHNIQUES FOR ENERGETIC NEUTRAL BEAM PROCESSING

FIELD

This disclosure relates to substrate processing using ion implantation and in particular to improved neutral beam apparatus and techniques.

BACKGROUND

The scaling of advanced devices such as integrated circuit based semiconductor devices to ever smaller dimensions relies heavily upon continued improvement in device materials, lithography and etching to process a device during fabrication. As the critical dimension (CD) of integrated circuit devices such as logic chips, memory chips, and system-on-a chip devices (SOC) scales to 45 nm and below, the side effects of substrate processing using ions may deleteriously impact device structure, properties, and fabrication.

To address these issues, an alternative to ion beam processing, atomic layer etching using neutral beams (also referred to as "fast atoms") has been identified as a key technology proposed for future damage-free, nano-scale device fabrication. This technique enables etching of very small device structures, including etching of sub-22 nm patterns on Si wafers. For example, several experimental and theoretical studies have demonstrated damage-free and high aspect ratio anisotropic etching of sub-22 nm devices using neutral beam sources. Neutral beams by their nature are not perturbed by charge buildup on the sidewalls of features such as line structures, pillars, and trenches. Accordingly, when approaching a substrate surface, energetic neutrals in a neutral beam can travel along their initial trajectories unimpeded by effects caused by charged particles present in surface structures of a device. Damage free etching may result using a neutral beam, in contrast to standard immersed plasma reactive ion etching where a substrate is subjected to multiple fluxes of impinging species such as ions, UV photons, electrons, and neutrals.

Neutral beam processing is accordingly viewed as a promising technology due at least in part to the combination of the directionality of energetic neutrals and the lack of complications that arise in charged particle beams. Potential uses of neutral beams include spacer etch of fin-type field effect transistors (finFETs), as well as use in self-aligned double patterning lithography (SADPL). Neutral beam processing may also be employed to enable damage free material modification to facilitate patterning such as performing implantation into a spacer and performing a subsequent soft etch process.

In conventional implementation, neutral beams are created for example by directing an ion beam at a glancing angle against a grounded surface, such as a graphite material. The neutrals created are then directed toward an intended substrate. In order to achieve a high degree of etch anisotropy, a key parameter for neutral beam processing is the ability to generate a narrow neutral beam angular distribution (NAD) about a well defined mean angle to a surface of a substrate. In addition, control of the mean beam angle of incidence of an ion beam upon a neutralizer is also important to achieve a high degree of neutralization.

In known techniques for neutral beam processing, grids or circular apertures are used to produce neutral ions that may be directed to a target to be processed. However, such apparatus provide limited processing flexibility. In addition, an image of the apertures that transmit a neutral beam may be transferred to a substrate that is exposed to the neutral beam thereby leading to non-uniform treatment of the substrate.

In view of the above, it will be appreciated that there is a need to develop improved techniques and apparatus for neutral beam processing of a substrate.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment, a processing system includes a plasma source chamber to generate a plasma. The processing system further includes an extraction assembly adjacent the plasma source chamber having an extraction plate and a beam modifier, where the extraction plate defines an extraction plate plane and an aperture to extract ions from the plasma source chamber into an ion beam, where the beam modifier is adjacent to the extraction plate and operative to adjust an ion beam trajectory angle of the ion beam with respect to a perpendicular to the extraction plate plane. The processing system also includes a neutralizer to receive the ion beam extracted by the extraction assembly, convert the ion beam to a neutral beam and direct the neutral beam towards a substrate, the neutralizer having one or more neutralizer plates arranged at a neutralizer plate angle, and the extraction assembly and the neutralizer interoperative to provide an ion beam incident angle of the ion beam with respect to the one or more neutralizer plates.

In a further embodiment, a method of processing a substrate with a neutral beam includes generating a plasma containing ions of a desired species to form the neutral beam, and extracting the ions from the plasma at an ion beam trajectory angle that forms a non-zero angle with respect to a perpendicular to a plane of the substrate. The method further includes providing a neutralizer having one or more neutralizer plates arranged at a neutralizer plate angle different than the first ion beam trajectory angle, forming a beam of neutrals by adjusting an ion beam incident angle between the neutralizer plate angle and the ion beam trajectory angle, and directing the beam of neutrals at the substrate at one or more neutral incidence angles with respect to the perpendicular to the plane of the substrate.

DETAILED DESCRIPTION

Figure 1A:
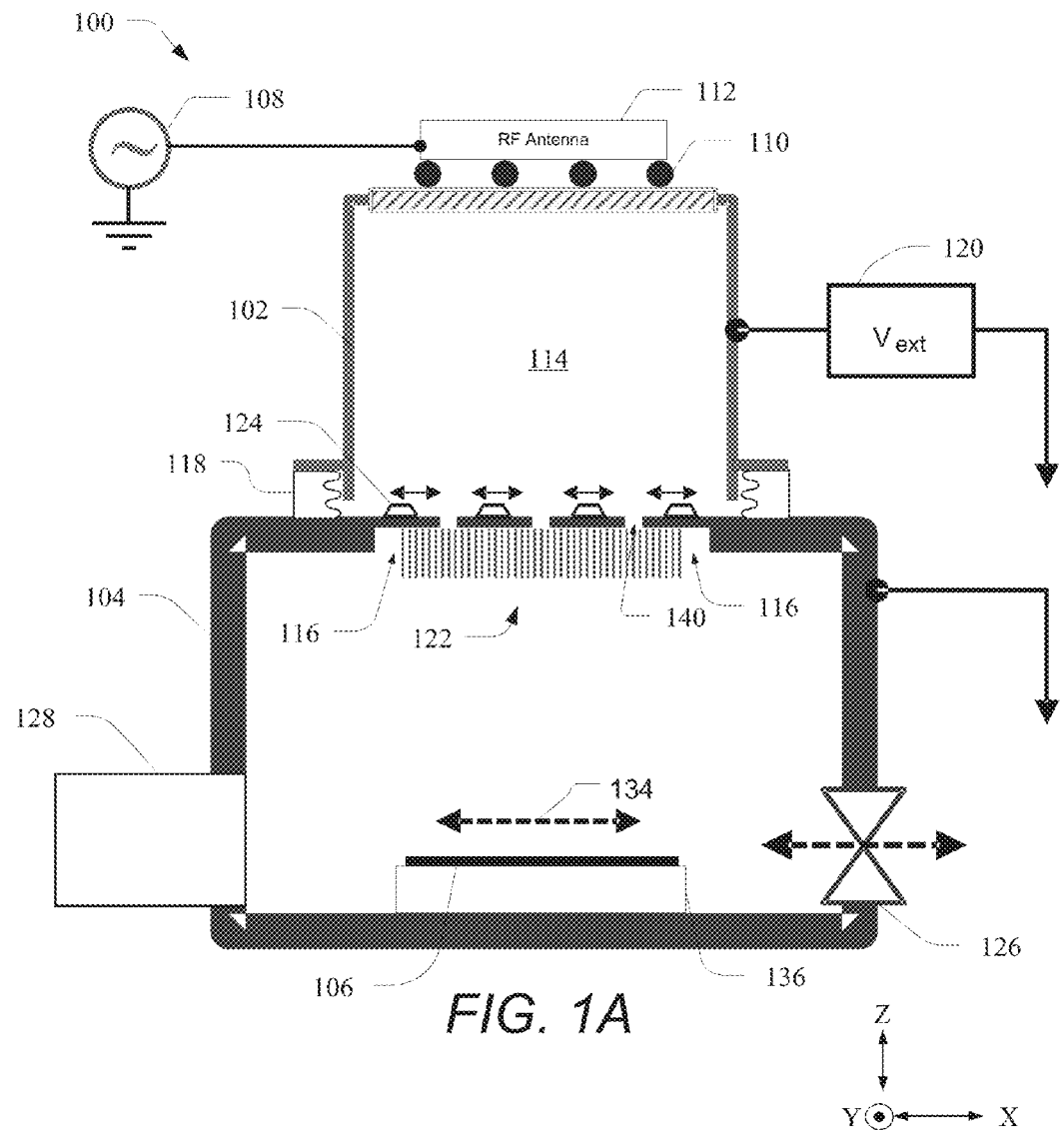
FIG. 1A depicts a side view of a processing system consistent with the present embodiments.

The present invention will now be described more fully hereinafter with reference to the accompanying drawings, in which embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

In various embodiments, apparatus and techniques are provided to produce a controlled neutral beam for processing, such as processing of a workpiece (substrate). The present embodiments facilitate, for example, processing of a substrate for etching, cleaning, patterning, and/or implantation of species into the substrate. In particular, apparatus of the present embodiments provide a uniform processing of large area substrates using neutral beams in which the angle(s) of incidence of the neutral beam may be tailored to the application.

FIG. 1A depicts a processing system 100 consistent with the present embodiments. The processing system 100 includes a plasma source chamber 102 that is configured to house a plasma 114. When gas is admitted into the plasma source chamber 102 through an inlet (not shown) power may be applied to generate the plasma 114. In the embodiment of FIG. 1A a radio frequency (RF) generator 108 is configured to generate RF power that is delivered to induction coil 110 via antenna 112. The processing system 100 further includes a substrate chamber 104, which is evacuated by pump 128.

When RF power is supplied to the induction coil 110 while gas is admitted into the plasma source chamber 102, a plasma 114 may be ignited. Although FIG. 1A depicts that the plasma 114 is generated by an induction coil 110, in other embodiments other known techniques may be used to generate the plasma 114. For example, a plasma source for the plasma 114 may, in various embodiments, be an in situ or remote, inductively coupled plasma source, capacitively coupled plasma source, helicon source, microwave source, or any other type of plasma source.

An extraction assembly 116 is provided to extract ions (not shown) from plasma 114 for processing of one or more substrates 106 disposed in substrate chamber 104. In various embodiments the extraction assembly 116 includes one or more extraction electrodes which may be configured as aperture plates that each include one or more apertures, as further depicted in FIG. 1B. An insulator 118 is provided to electrically isolate the extraction assembly 116 from the plasma source chamber 102. A plasma source chamber voltage supply $V_{ext}$ 120 is configured to apply a voltage to the plasma source chamber 102. In the configuration of FIG. 1A, the extraction assembly 116 is referenced to ground potential. When the plasma source chamber voltage supply $V_{ext}$ 120 (hereinafter simply "$V_{ext}$ 120") generates a positive voltage, for example, the plasma potential of plasma 114 rises to a positive voltage slightly in excess of the positive voltage generated by $V_{ext}$ 120. For example, when $V_{ext}$ 120 generates a positive voltage of 1000 V, the potential of plasma source chamber 102 is set at +1000 V, and the plasma potential of plasma 114 attains a value typically of about 1010 to 1030 V. Accordingly, because extraction assembly 116 is grounded, positive ions are extracted from the plasma 114 through the extraction assembly 116 at an energy of 1010-1030 eV in the case of singly charged ions.

In other embodiments, a negative voltage may be applied by $V_{ext}$ 120 while the extraction assembly 116 is grounded, in which circumstance negative ions generated in the plasma 114 are extracted from the plasma 114 at an energy slightly lower than that supplied by $V_{ext}$ 120 due to the fact that the plasma potential of plasma 114 is slightly more positive than the potential of plasmas source chamber 102.

In various embodiments the voltage from $V_{ext}$ 120 may be applied as a continuous voltage or as a pulsed voltage. Pulsed voltage may be employed to control the rate of energetic neutrals provided to the substrate 106 according to know techniques. For example, the duty cycle of a pulsed voltage applied by $V_{ext}$ 120 can be varied wherein the relative duration of "on" periods when a positive voltage is generated and positive ions are extracted from the plasma 114, is greater or lesser than a duration of "off" periods when no voltage is applied to plasma source chamber 102, and no positive ions are extracted.

The processing system 100 further includes a neutralizer 122 that is configured to neutralize ions extracted by the extraction assembly 116. Accordingly, as discussed further with respect to FIGS. 2A and 2B, energetic neutrals may be produced having energy defined by the voltage applied by $V_{ext}$ 120. Energetic neutrals are thereafter directed to the substrate 106 for processing. A substrate holder 136 is configured to move along the direction 134 which is parallel to the X-axis in the Cartesian coordinate system shown and parallel to the short dimension of the apertures 140 shown in FIG. 1B. Substrates 106 may be transferred into or out of the substrate chamber 104 via the loadlock valve 126. The processing system 100 also includes a set of beam modifiers 124 that are configured to vary the angle of ions extracted from the plasma source chamber 102. In operation the processing system 100 is configured to provide one or more beams of energetic neutrals to the substrate 106. As detailed in the FIGs. to follow the substrates 106 may be scanned with respect to neutralizer 122 in a manner that provides uniform exposure to neutral beams whose angle is tailored to a desired application.

Figure 1B:
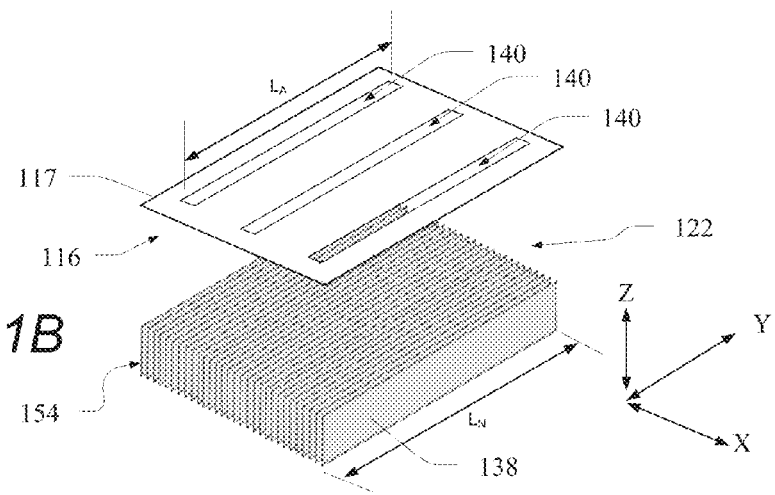
FIG. 1B depicts a perspective view of a beam neutralizer component consistent with the present embodiments.

FIG. 1B provides an exploded perspective view of an extraction assembly 116 and neutralizer 122. In this embodiment, the extraction assembly 116 contains a single extraction plate 117 having a set of apertures 140 that having a long dimension $L_A$ which may span a distance sufficient to cover an entire substrate along a given substrate dimension in some embodiments. The neutralizer 122, which may be electrically connected to the extraction assembly 116 in operation, contains a plurality of neutralizer plates 138 having a length $L_N$ along the Y-direction. In various embodiments, the length $L_N$ is at least as large as $L_A$ so that all the ions that are extracted through the apertures 140 pass through neutralizer 122. In various embodiments, the neutralizer 122 may be composed of a conventional material such as graphite, silicon, silicon carbide, etc.

Figure 2B:
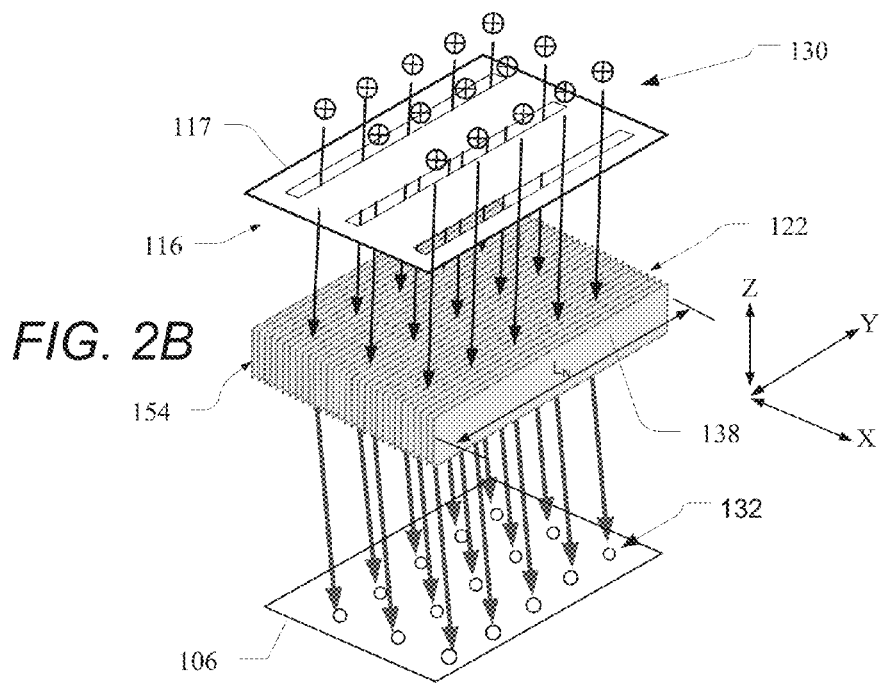
FIG. 2B depicts a perspective view of the beam neutralizer component of FIG. 1B in operation.
Figure 2A:
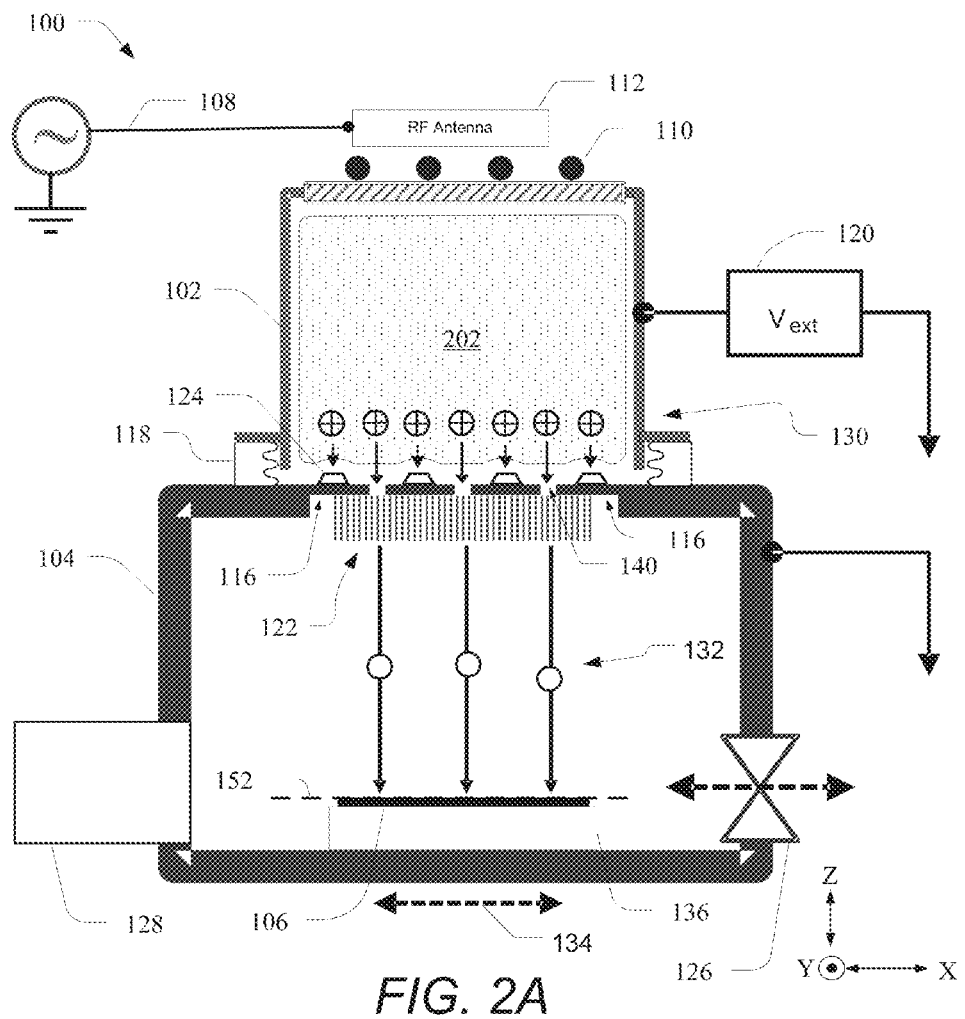
FIG. 2A depicts one instance of operation of the processing system of FIG. 1A.

FIG. 2A depicts a side view of the processing system 100 in one instance in which a plasma 202 is generated that contains positive ions 130. FIG. 2B depicts an exploded perspective view of generation of (positive) ions 130 and neutrals 132 corresponding to the instance shown in FIG. 2A. In one scenario, the substrate 106 is loaded into processing system 100 for processing by energetic neutrals of a desired species, which processing may involve implantation, etching, patterning, or other processing. Additionally, a gas to produce neutrals of the desired species is introduced into the plasma source chamber 102, thereby producing the ions 130 when the RF generator applies RF power to the induction coil 110. The ions 130 are extracted through apertures 140 and attain an energy defined by a voltage applied to plasma source chamber 102 by $V_{ext}$. The ions 130 impinge upon the neutralizer 122 at a small ion beam incident angle discussed below and are converted into neutrals 132 after striking the neutralizer 122. The ions 130 then reflect from the neutralizer 122 and strike the substrate 106 as shown in FIG. 2B. Because the neutrals 132 carry no electrical charge, the neutrals 132 may impinge upon the substrate 106 with the energy defined by $V_{ext}$. Although the neutrals 132 are depicted as traveling along trajectories generally perpendicular to the plane 152 of the substrate, the extraction assembly 116 and neutralizer components may be configured to direct energetic neutrals at other angle(s) to the substrate, as detailed in the discussion to follow.

Figure 2C:
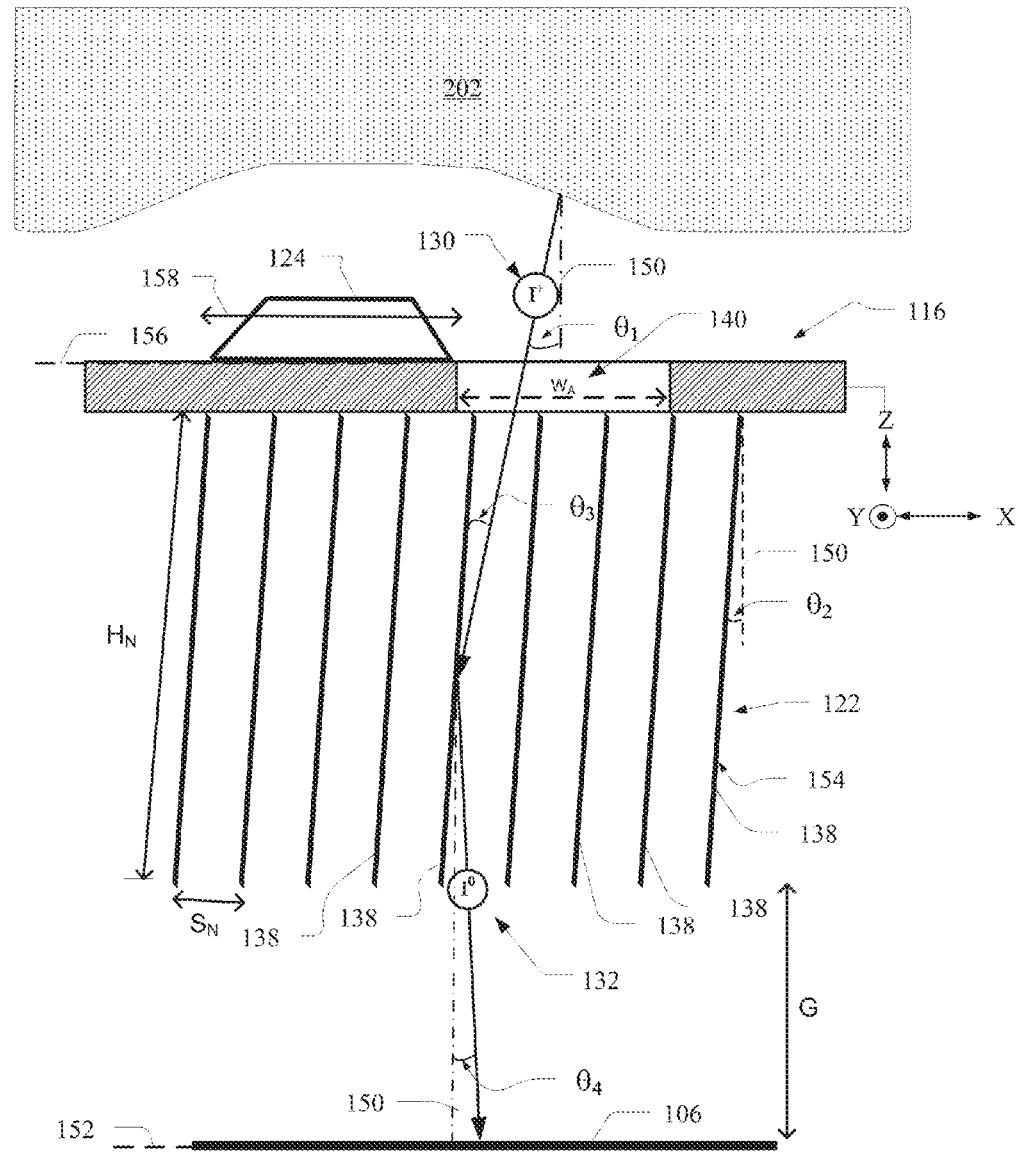
FIG. 2C depicts details of geometry of neutral generation of a beam neutralizer component consistent with the present embodiments.

FIG. 2C depicts details of the geometry for generation of energetic neutral beams consistent with the present embodiments. In FIG. 2C there is shown an arrow representing the trajectory of a single ion 130 (I$^+$) which represents a mean trajectory for ions extracted from the plasma 202 through the aperture 140. The trajectory of the ion 130 defines an ion beam trajectory angle $\theta_1$ with respect to the perpendicular 150 to the plane 156 of the extraction assembly 116, which plane may be parallel to the plane 152 of the substrate 106. In various embodiments the ion beam trajectory angle $\theta_1$ may be zero or a number greater than zero. As further illustrated in FIG. 2C, the neutralizer 122 is composed of multiple parallel neutralizer plates 138 whose sides 154 (see also FIGS. 1B, 2B) form a neutralizer plate angle $\theta_2$ with respect to the perpendicular 150. As a result, the ion beam strikes the neutralizer plate at an ion beam incident angle $\theta_3$. Consistent with various embodiments, the ion beam trajectory angle $\theta_1$ and neutralizer plate angle $\theta_2$ are arranged to produce a desired ion beam incident angle $\theta_3$ for ions striking the neutralizer 122. In some embodiments, the absolute value of this ion beam incident angle $\theta_3$ may be set to equal a couple degrees up to about fifteen degrees in order to optimize neutralization of the ions 130. In some embodiments, neutralization efficiency of ions 130, that is the percentage of ions 130 incident upon neutralizer 122 that are neutralized, may exceed 95%.

Finally, as also shown in FIG. 2C, ions 130 that are reflected from a neutralizer plate 138 may be neutralized forming a neutral 132 that impinges upon the substrate at a neutral incidence angle $\theta_4$ with respect to the perpendicular 150. Thus, the setting of the ion beam trajectory angle $\theta_1$ and neutralizer plate angle $\theta_2$ may at least in part set the neutral incidence angle $\theta_4$.

It is to be noted that although FIG. 2C illustrates a single trajectory of a neutral 132 defining a single neutral incidence angle $\theta_4$ in some instances neutrals may impinge upon the substrate 106 over a range of angles at any given instance. Factors that influence the distribution of neutral incidence angles for neutrals 132 incident upon the substrate 106 include the ratio of the separation $S_N$ of adjacent neutralizer plates to the height $H_N$ of neutralizer plates 138 along the sides 154. Other factors influencing the distribution of angles of incidence of neutrals upon the substrate 106 include the distribution of ion beam trajectory angle $\theta_1$ for ions extracted from the plasma 114. In some embodiments, $S_N$ may be several tenths of one millimeter to several millimeters, $H_N$ may be several millimeters to several centimeters, and the ratio of $S_N$ to the height $H_N$ may be five or greater. In this manner, at any given instance neutrals 132 may strike the substrate 106 over a narrow distribution of neutral incidence angles.

As also shown in FIG. 2C, in order to adjust the ion beam trajectory angle $\theta_1$ a beam modifier 124 may be moved along the direction 158 that is generally parallel to the plane 156. In so doing, the beam modifier 124 may influence the trajectories of ions 130 that travel through an aperture 140. Consistent with various embodiments, the average ion beam trajectory angle $\theta_1$ may be adjusted in a manner that is coupled to adjustment of the neutralizer plate angle $\theta_2$ in order to efficiently generate a neutral beam having a desired neutral incidence angle $\theta_4$ upon the substrate 106. For example, ions may be extracted from the plasma 202 having an average ion beam trajectory angle $\theta_1$ of 35 degrees and directed upon neutralizer plates 138 having a neutralizer plate angle $\theta_2$ of 30 degrees, thereby defining a relative incidence angle $\theta_3$ of five degrees, which may yield a high neutralization efficiency in excess of 90% in some examples. If the ions 130 are reflected in an elastic manner from the neutralizer plate 138, the neutrals 132 thus formed define a neutral incidence angle $\theta_4$ upon the substrate 106 of 25 degrees, assuming that ions 130 are only reflected a single time within the neutralizer 122.

Figure 2D:
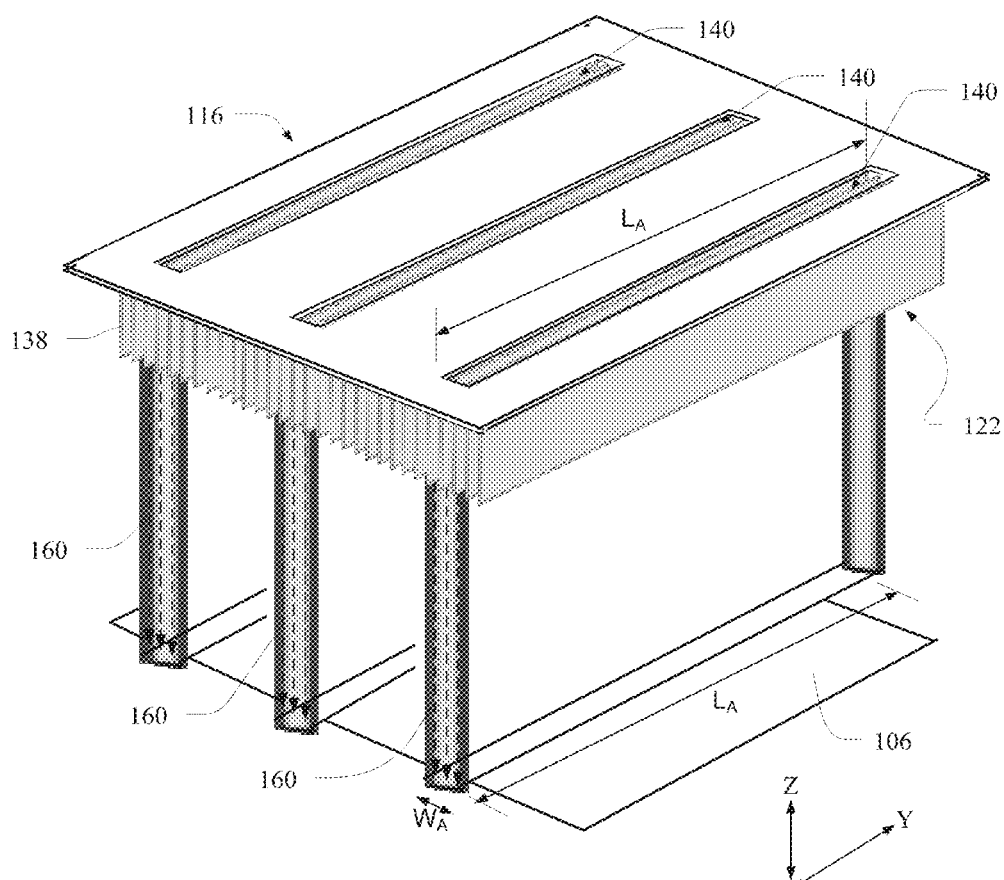
FIG. 2D depicts details of geometry of neutral ribbon beam generation by an extraction assembly and beam neutralizer.

As further illustrated in FIG. 2C, an aperture 140 may span more than one neutralizer plate 138 along the direction defined by the X-axis as shown. Thus, neutrals formed by the neutralizer 122 may emerge from regions between multiple pairs of adjacent neutralizer plates 138 to generally form a beam of neutrals whose dimensions are defined by the dimensions of the aperture 140. This feature is illustrated in FIG. 2D, which depicts a perspective view of an extraction assembly 116 and neutralizer 122 showing formation of a set of neutral beams 160. In particular, the extraction assembly 116 contains three elongated apertures 140 that define three respective neutral beams 140 that are characterized by a cross-sectional length $L_A$ and cross-sectional width $W_A$ in the X-Y plane of the apertures 140. As illustrated, each neutral beam 160 has the shape of a ribbon beam, which is defined herein as a beam in which the cross-sectional length $L_A$ is greater than cross-sectional width $W_A$ by a factor of at least two. Each neutral beam 140 includes multiple neutrals (shown by the dotted arrows) among which different neutrals may emerge from between different pairs of neutralizer plates 138. Because the substrate 106 is configured to move along the X-direction as discussed previously, any non-uniformities of neutral density along the X-direction within a neutral beam 140 and between neutral beams 140 can be eliminated during scanning of the substrate 106 with respect to the extraction assembly 116 and neutralizer 122.

Referring again to FIG. 2C, in various embodiments the aperture width $W_A$ may range from several tenths of one millimeter to one centimeter or greater. Moreover, although $S_N$ is depicted as smaller than $W_A$ in FIG. 2C, in various additional embodiments, $S_N$ may be the same as or larger than $W_A$. Additionally, in order to maintain an instantaneous narrow distribution of neutral incidence angles $\theta_4$ the gap G between the bottom of the neutralizer 122 where neutrals exit the neutralizer 122 and the substrate 106 may be set at a relatively small value with respect to height $H_N$. This reduces the divergence of neutrals in a beam of neutrals exiting the neutralizer 122. For example, in a system in which $H_N$ is 10 mm, G may be between 5 mm and 10 mm. In some embodiments, a divergence angle in such a system (that is, distribution of neutral incidence angles $\theta_4$) may be 0.1 to 0.5 degrees.

Although FIGS. 1A to 2D depict the production of neutrals or neutral beams, it is to be noted that at least a portion of species exiting the neutralizer 122 may remain as ions.

Figure 3:
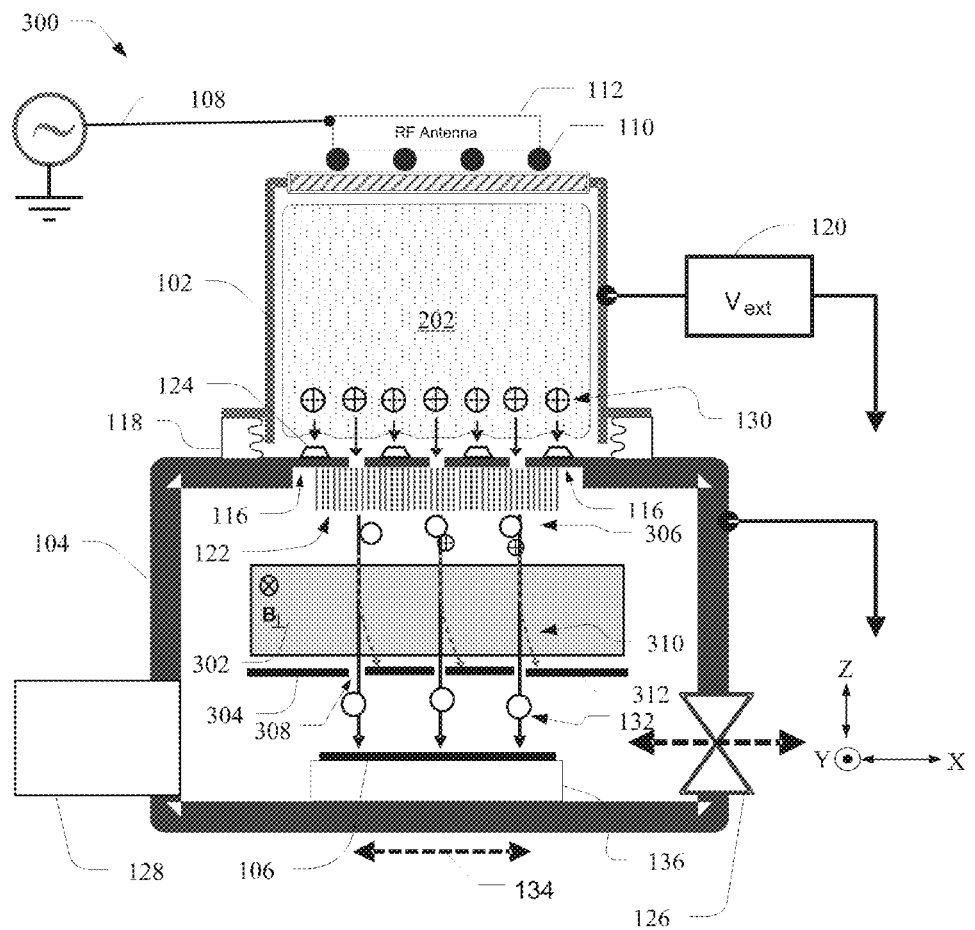
FIG. 3 depicts a side view of another processing system consistent with the present embodiments.

Accordingly, consistent with additional embodiments, a deflection assembly is provided to generate a deflecting field that is effective to deflect the trajectory of charged particles such as ions so that the deflected species can be screened from the substrate. Such a deflection assembly may involve electrostatic deflectors that generate a deflecting electrostatic field or may entail a magnetic assembly that generates a deflecting magnetic field. FIG. 3 depicts another embodiment of a processing system 300 that provides deflection of ions. In this embodiment, the processing system 300 includes the same components as processing system 100 as discussed above. Additionally, the processing system 300 includes a magnetic assembly 302 and analyzer 304. The magnetic assembly 302 is configured to deflect any ions that may exit the neutralizer 122. The analyzer (or "mass slit") 304 is configured to block deflected ions while transmitting neutrals that emerge from the neutralizer and are undeflected by the magnetic assembly 302.

The magnetic assembly 302 may be a permanent magnetic structure or an electromagnet structure that is configured to transmit particles 306 that exit the neutralizer 122 in a central region (not visible) of the magnetic assembly 302. The magnetic assembly 302 is configured to generate a magnetic field in a direction generally perpendicular to the direction of travel of the particles 306 that traverse through the magnetic assembly 302, which magnetic field is directed along the Y-axis. As shown in FIG. 3, the neutrals 132 pass through the magnetic assembly with their trajectories unaltered by the magnetic field, as indicated by the solid arrows. The neutrals 132 then pass through apertures 308 provided in the analyzer 304 and strike the substrate 106.

Although the neutralizer 122 may neutralize a majority of ions 130 that pass through the neutralizer 122, in some instances ions 130 may transit the neutralizer without being neutralized. Accordingly, the particles 306 that exit neutralizer 122 may include ions as illustrated. However, charged particles such as positive ions experience a deflecting force from the magnetic field generated by the magnetic assembly 302. As illustrated by the dashed arrows, the trajectory of deflected ions 310 is such that blocking portions 312 of the analyzer 304 intercept the deflected ions 310 and prevents them from impinging on substrate 106. In this manner, the fraction of energetic particles that strike the substrate 106 as ions can be lessened.

Figure 4A:
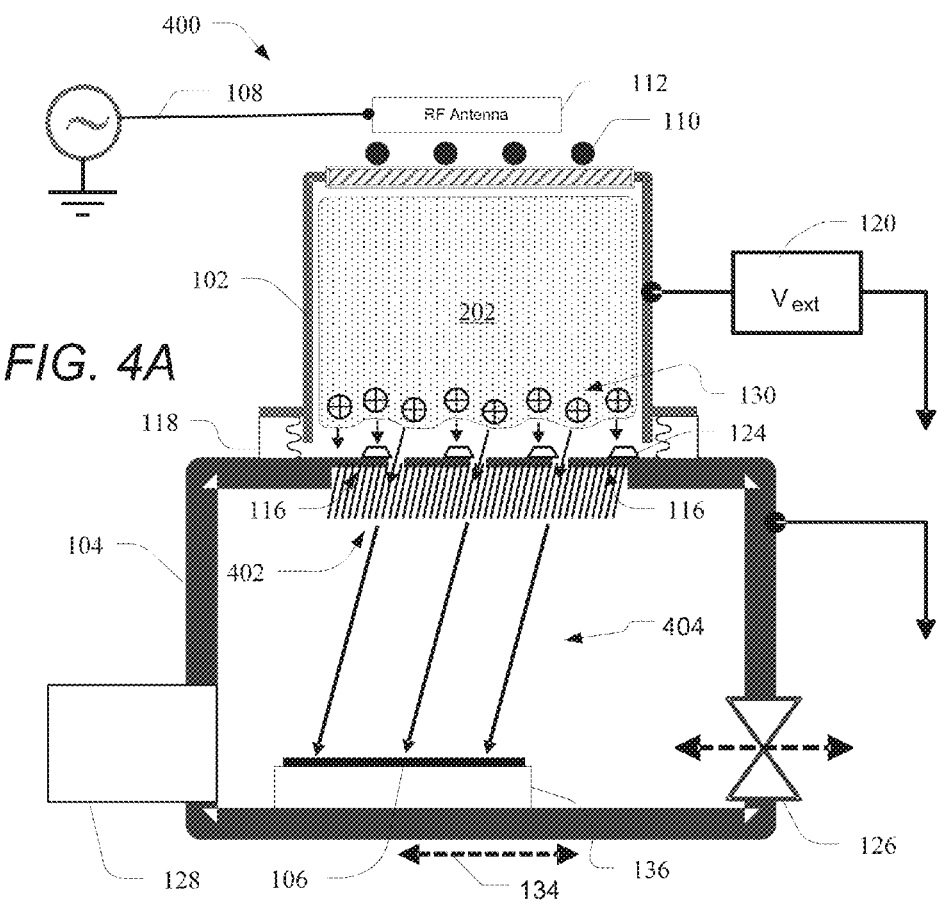
FIG. 4A depicts a side view of a further processing system consistent with the present embodiments.

As noted previously, the present embodiments provide neutral beam processing of substrates in which the neutral incidence angle $\theta_4$ of a neutral beam may be non-zero, that is, in which the average incidence angle of neutrals is not perpendicular to the plane 152 of substrate 106. Such an angled neutral beam that contains non-perpendicular neutrals may be useful to process substrate features including finFET devices, gate stack structures, line type structures, trench structures and other structures. FIG. 4A depicts a further embodiment of a processing system 400 that provides angled neutral beam processing. The term "angled" as used herein with respect to neutralizers, neutrals or neutral beams, refers to neutralizer plates or neutral trajectories that form a non-zero angle with respect to the perpendicular to a substrate plane and/or extraction plate plane. The processing system 400 contains features as generally described above with respect to the processing system 100, except that neutralization is provided by an angled neutralizer 402 in which the neutralizer plate angle $\theta_2$ is non-zero. The energetic neutrals 404 shown by the solid arrows also strike the substrate 106 at non-perpendicular incidence.

Figure 4B:
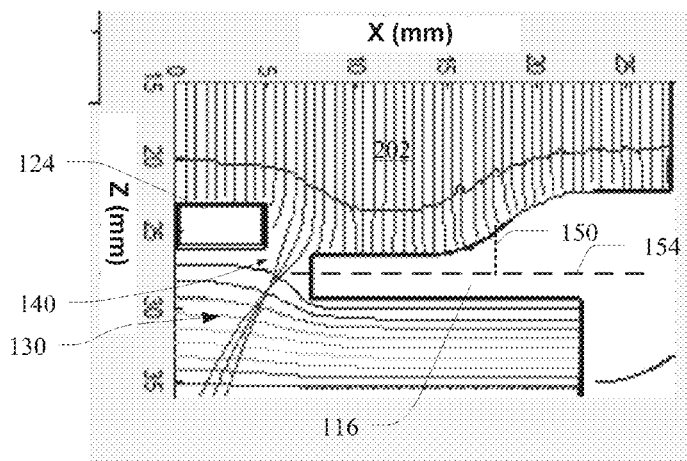
FIG. 4B depicts results of simulation of an exemplary extraction apparatus geometry showing ion trajectories.

In order to direct ions from the plasma 202 at the proper ion beam trajectory angle $\theta_1$ for efficient neutralization as well as efficient generation of neutral flux, the beam modifiers 124 are shifted with respect to the extraction assembly 116. This may modify ion trajectories of ions 130 extracted from plasma 202. FIG. 4B depicts results of simulation of ion trajectories consistent with the conditions provided by the scenario depicted in FIG. 4A. In the simulation, a beam modifier extends over an aperture 140, thereby causing ions to exit the aperture 140 at a non-zero ion beam trajectory angle $\theta_1$ with respect to the perpendicular 150. In various embodiments, the processing system 400 may operate over a large range of plasma power and gas pressure to produce the desired ion beam trajectory angle $\theta_1$. The ions 130 subsequently enter a neutralizer (not shown) and can be efficiently neutralized when the neutralizer plate angle $\theta_2$ forms a small angle, such as 2-15 degrees, with respect to the ion beam trajectory angle $\theta_1$.

Figure 5:
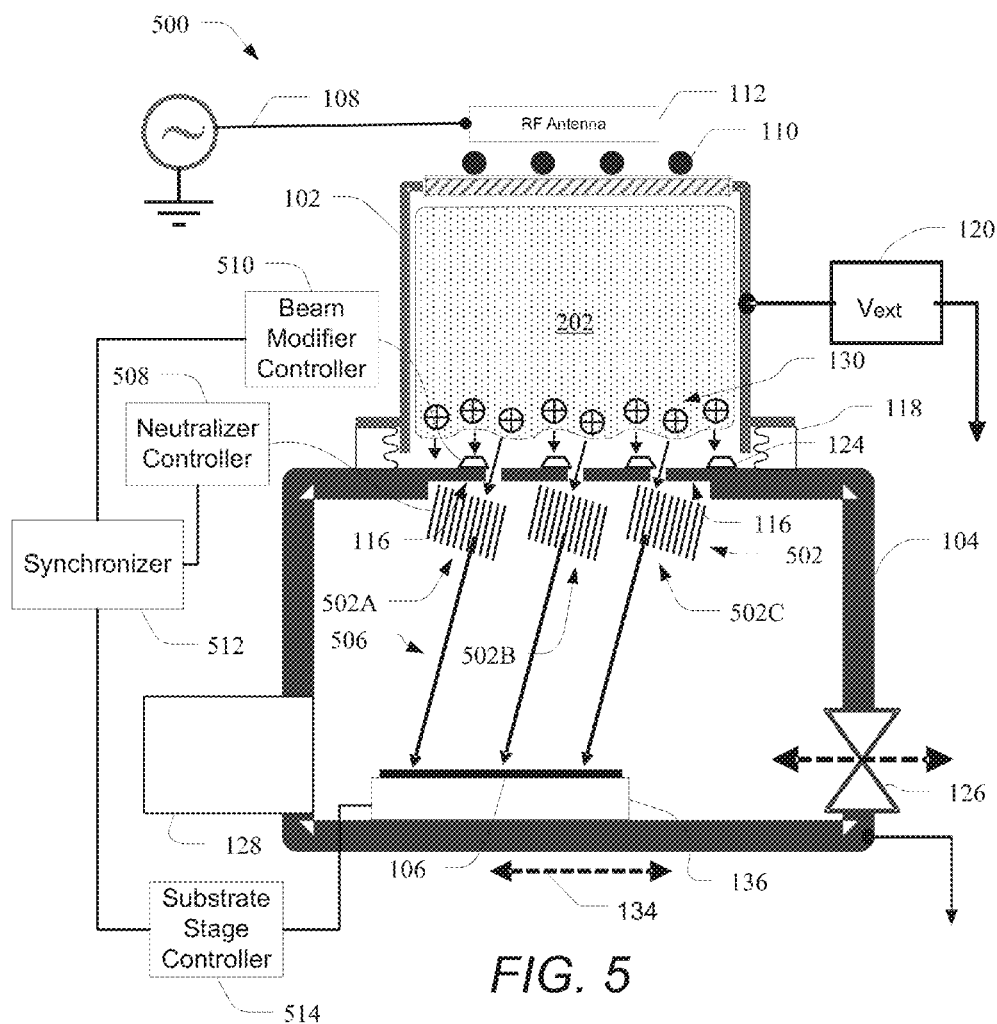
FIG. 5 depicts a side view of still another processing system consistent with the present embodiments.

FIG. 5 depicts a further embodiment of a processing system 500 that provides angled neutral beam processing. The processing system 500 contains features as generally described above with respect to the processing system 100. However, instead of a fixed neutralizer, the processing system 500 a variable angle neutralizer 502. The variable angle neutralizer 502 includes multiple neutralizer components 502A, 502B, 502C, each of which is arranged to intercept ions 130 emerging from the extraction assembly 116. Moreover, the neutralizer plate angle $\theta_2$ may be varied for each neutralizer component 502A, 502B, 502C. This facilitates the ability to vary the neutralizer plate angle neutralizer plate angle $\theta_2$ in tandem with variation in the ion beam trajectory angle $\theta_1$ of the ions 130 so that desired neutral incidence angle $\theta_4$ (see FIG. 2C for illustration of angles $\theta_1$, $\theta_2$, and $\theta_4$) of neutral beam(s) 506 can be conveniently varied. In one example a neutralizer controller 508 may control the neutralizer plate angle $\theta_2$ of the multiple neutralizers so that the neutralizer plate angle $\theta_2$ can be dynamically varied during processing of a substrate 106. In this manner, multiple neutral beams having different neutral incidence angles $\theta_4$ may be provided in succession to process a substrate 106 according to a desired treatment. This may be useful to tailor the exposure to substrates having surfaces disposed at different angles and/or different depths with respect to a substrate plane.

As further illustrated in FIG. 5, a beam modifier controller 510 is provided to shift the position of beam modifiers 124, thereby controlling the ion beam trajectory angle $\theta_1$ as discussed above. A synchronizer 512 is further provided that is coupled to the beam modifier controller 510 and neutralizer controller 508. The synchronizer 512 may generate signal(s) sent to each of the beam modifier controller 510 and neutralizer controller 508 to synchronize changes in position of the beam modifiers 124 with changes in the neutralizer plate angle $\theta_2$.

In this manner the ion beam trajectory angle $\theta_1$ and the neutralizer plate angle $\theta_2$ may be varied in a coupled fashion. For example, it may be determined that a relative incidence angle $\theta_3$ of five degrees, yields an optimum neutralization efficiency in excess of 90%. It may further be desirable to direct a neutral beam toward a substrate at a series of different neutral incidence angles $\theta_4$. In order to vary neutral incidence angles $\theta_4$ while maintaining a high neutralization efficiency, the synchronizer 512 may send signals to the beam modifier controller 510 and neutralizer controller 508 to move in concert. This may generate, for example, movement neutralizer 122 and beam modifiers 124 by any combination of rotation and in a manner that varies the ion beam trajectory angle $\theta_1$ and the neutralizer plate angle $\theta_2$ so as to maintain a constant relative incidence angle $\theta_3$ of five degrees. For example, referring also to FIG. 2C, in a first setting, the beam modifiers 124 may be arranged so that an the ion beam trajectory angle $\theta_1$ of ten degrees results, and the neutralizer plate angle $\theta_2$ may be arranged at five degrees, thereby yielding the desired relative incidence angle $\theta_3$ of five degrees. This may yield a neutral incidence angle $\theta_4$ of zero degrees or normal incidence to a plane 152 of the substrate, which may be useful for processing certain portions of patterned features (not shown) of a substrate 106, such as top portions of lines, holes or pillars. The synchronizer 512 may subsequently send signals to the beam modifier controller 510 and neutralizer controller 508 so that the neutralizer 122 and beam modifiers 124 move in a manner that changes the ion beam trajectory angle $\theta_1$ to forty degrees and the neutralizer plate angle $\theta_2$ to thirty five degrees, thereby maintaining the relative incidence angle $\theta_3$ of five degrees. At this latter setting, the neutral incidence angle $\theta_4$ may equal thirty degrees, which may be useful for processing side portions of lines, holes or pillars, for example.

As further illustrated in FIG. 5, the synchronizer 512 of system 500 is coupled to a substrate stage controller 514 that is operative to move the substrate stage 136 at least along the direction 134 as discussed previously. In various embodiments, the synchronizer 512 may send control signals to the substrate stage controller 514 to synchronize movement of the substrate stage 136 with changes in position of the beam modifiers 124 and/or changes in the neutralizer plate angle $\theta_2$ discussed above. In some instances, the synchronizer 512 may send signals to the beam modifier controller 510 and neutralizer controller 508 so that the neutralizer 122 and beam modifiers 124 cause the beam modifiers 124 and neutralizer 122 to vary the respective ion beam trajectory angle $\theta_1$ the neutralizer plate angle $\theta_2$ in a coupled fashion so as to vary neutral incidence angle $\theta_4$ while maintaining a constant the relative incidence angle $\theta_3$ as discussed above. For example, $\theta_1$ and $\theta_2$ may be varied continuously to as to continuously vary (sweep) the neutral incidence angle $\theta_4$ through a desired angular range. At the same time, the synchronizer 512 may send signals to substrate stage controller 514 to move the substrate stage 136 along the direction 134. In this manner, one or more neutral beams 506 may be swept through a range of angles to treat different surfaces of a substrate 106 while the substrate is moving with respect to the neutral beams 506. In some embodiments the speed at which the neutral beams 506 are swept through a range of angles may be sufficiently rapid to treat all surfaces of a features of a portion of a substrate 106 that are exposed to a neutral beam 506 before that portion of the substrate 106 is moved outside of the neutral beam 506. In this manner, all desired portions of a substrate 106 may be subject to processing by neutrals over a range of angles while the substrate is continuously scanned in the direction 134.

Of course in other embodiments, the neutral beams 506 need not be swept continuously through an angular range, but rather may be stepped between discrete neutral incidence angles $\theta_4$ while the substrate 106 is scanned along the direction 134. Moreover, in order to provide a pattern of neutral beam processed features, the substrate 106 may be stepped between different portions of the substrate 106 so as to leave certain regions of substrate 106 unexposed to neutral beams 506.

Figure 6:
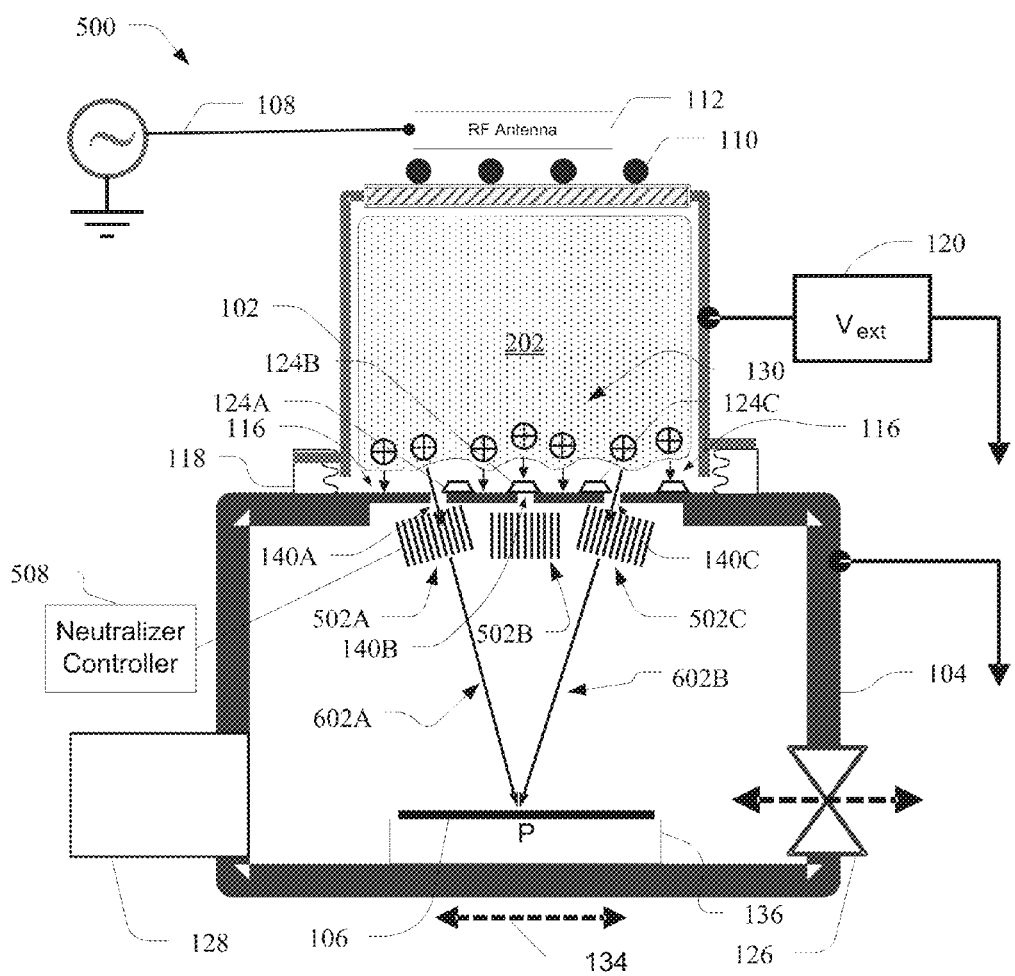
FIG. 6 depicts a side view of a yet another further processing system consistent with the present embodiments.

FIG. 6 depicts another configuration of the processing system 500 that provides focused neutral beam processing. In the instance depicted in FIG. 6 the neutralizer components 502A, 502C are rotated so that respective neutral beams 602A, 602B are directed inwardly to form converging neutral beams directed toward a region P on the substrate 106. As further illustrated in FIG. 6 the beam modifiers 124A and 124C are arranged partially over respective apertures 140A, 140C causing ions to exit through the respective apertures 140A, 140C in respective directions generally aligned with the respective neutral beams 602A, 602B. For example, referring also to FIG. 2C, ions extracted through aperture 140A may define an ion beam trajectory angle $\theta_5$ (not explicitly shown) with respect to perpendicular 150 while ions extracted through aperture 140C may define the ion beam trajectory angle $\theta_6$, which is opposite to ion beam trajectory angle $\theta_5$ with respect to the perpendicular 150. Moreover, the neutral beam 602A may define a neutral incidence angle $\theta_7$ with respect to the perpendicular 150 while the neutral beam 602B defines a neutral incidence angle $\theta_8$ that is opposite to neutral beam angle $\theta_7$ with respect to the perpendicular 150. In addition, the beam modifier 124B is arranged to block aperture 140B. In this manner, processing of the substrate 106 is simultaneously provided from two different neutral incidence angles that form a mirror image with respect to a perpendicular 150.

In summary, the present embodiments provide novel neutral beam apparatus and techniques for processing a substrate. Apparatus is provided to generate angled neutral beams to a substrate, and in particular embodiments, the angle of neutral beams directed toward a substrate may be varied. This facilitates flexible processing such as processing a substrate using neutral beams over multiple different angles to treat different surface features. By providing independent control of the angle of neutralizer plates and the angle of ions exiting a plasma, the neutralization efficiency can be optimized while providing neutral beams at a desired angle with respect to the substrate.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes.

What is claimed is:

1. A processing system comprising:
    a plasma source chamber configured to generate a plasma;
    an extraction assembly adjacent the plasma source chamber having an extraction plate and a beam modifier, the extraction plate defining an extraction plate plane and an aperture to extract ions from the plasma source chamber into an ion beam, the beam modifier disposed within the plasma source chamber between the plasma and the extraction plate and operative to adjust an ion beam trajectory angle of the ion beam with respect to a perpendicular to the extraction plate plane; and
    a neutralizer to receive the ion beam extracted by the extraction assembly, convert the ion beam to a neutral beam and direct the neutral beam towards a substrate, the neutralizer having one or more neutralizer plates arranged at a neutralizer plate angle, wherein the extraction assembly and the neutralizer are interoperative to provide an ion beam incident angle of the ion beam with respect to the one or more neutralizer plates.

2. The apparatus of claim 1, wherein the neutralizer is configured to direct the neutral beam to the substrate at a multiplicity of neutral incidence angles with respect to a perpendicular to a plane of the substrate.

3. The apparatus of claim 1, wherein the beam modifier is operative to move in a first direction parallel to the extraction plate plane from a first position that generates a first ion trajectory angle to a second position that generates a second ion trajectory angle different from the first ion beam trajectory angle.

4. The apparatus of claim 1, further comprising a set of beam modifiers, wherein the set of beam modifiers comprises:
a first beam modifier operative to generate a first ion beam trajectory angle; and
a second beam modifier operative to simultaneously generate a second ion beam trajectory angle different from the first ion beam trajectory angle.

5. The apparatus of claim 1, wherein the neutralizer comprises a set of mutually parallel neutralizer plates aligned at a neutralizer plate angle with respect to the perpendicular to an extraction plate plane, the neutralizer plate angle being different than the ion beam trajectory angle.

6. The apparatus of claim 1, wherein the neutralizer is operative to adjust the neutralizer plate angle.

7. The apparatus of claim 1, wherein the neutralizer comprises a plurality of neutralizer components that each includes multiple mutually parallel neutralizer plates.

8. The apparatus of claim 7, wherein the plurality of neutralizer components is interoperative to define a plurality of different neutralizer plane angles, and wherein the neutralizer is configured to generate a plurality of converging neutral beams.

9. The apparatus of claim 1, wherein the extraction assembly comprises one or more apertures operative to generate a ribbon neutral beam having a cross-sectional width and cross-sectional length at least two times the cross-sectional width.

10. The apparatus of claim 1 further comprising:
a deflection assembly disposed between the neutralizer and substrate and configured to generate a deflecting field to deflect ions that exit the neutralizer; and
an analyzer disposed between the deflection assembly and substrate and configured to block the deflected ions from impinging on the substrate and transmit neutrals that exit the neutralizer.

11. The apparatus of claim 1, further comprising:
a substrate stage to move the substrate along at least one scan direction; and
a synchronizer to synchronize adjustment of position of the set of beam modifiers, adjustment of neutralizer plate angle, and/or movement of the substrate stage.

12. A method of processing a substrate with a neutral beam, comprising:
generating a plasma within a plasma source chamber, the plasma containing ions of a desired species to form the neutral beam;
extracting the ions from the plasma at an ion beam trajectory angle that forms a non-zero angle with respect to a perpendicular to a plane of the substrate, wherein the ion beam trajectory angle is adjustable by moving a beam modifier, disposed adjacent an extraction plate, in a direction parallel to a plane defined by the extraction plate;
providing a neutralizer having one or more neutralizer plates arranged at a neutralizer plate angle different than the first ion beam trajectory angle;
forming a beam of neutrals by adjusting an ion beam incident angle between the neutralizer plate angle and the ion beam trajectory angle; and
directing the beam of neutrals at the substrate at one or more neutral incidence angles with respect to the perpendicular to the plane of the substrate.

13. The method of claim 12, wherein the ion beam incident angle is less than fifteen degrees and greater than one degree, wherein the ion beam incident angle yields a maximum fraction of incident ions that are neutralized by the neutralizer.

14. The method of claim 12 further comprising:
extracting first ions from the plasma at a first ion beam trajectory angle and second ions at a second ion beam trajectory angle opposite the first ion beam trajectory angle with respect to the perpendicular;
forming first neutrals by intercepting the extracted first ions by a first set of neutralizer plates arranged at a first neutralizer plate angle,
forming second neutrals by intercepting the extracted second ions by a second set of neutralizer plates arranged at a second neutralizer plate angle opposite the first neutralizer plate angle with respect to the perpendicular;
directing the first neutrals at the substrate at a first neutral incidence angle with respect to the perpendicular; and
directing the second neutrals at the substrate at a second neutral incidence angle opposite the neutral incidence angle with respect to the perpendicular.

15. The method of claim 12 further comprising:
deflecting ions that exit the one or more neutralizer plates through a deflecting field;
intercepting the deflected ions at blocking portions of an analyzer; and
transmitting the beam of neutrals through one or more apertures in the analyzer.

16. An apparatus for generating one or more angled neutral beams, comprising:
a plasma source chamber configured to generate a plasma containing ions to form the angled neutral beam;
an extraction plate electrically isolated from and adjacent to the plasma source chamber, the extraction plate having one or more apertures configured to extract the ions from the plasma;
a set of beam modifiers adjacent the extraction plate and configured to vary an ion beam trajectory angle of ions extracted through the extraction plate, the set of beam modifiers disposed within the plasma source chamber between the plasma and the extraction plate; and
a neutralizer adjacent to the extraction plate and configured to:
receive the ions extracted through the extraction plate;
reflect the received ions as neutrals; and
direct the reflected ions as one or more neutral beams to the substrate at one or more angles with respect to a perpendicular to the substrate.

17. The apparatus of claim 16, wherein the extraction plate further comprising a set of one or more elongated apertures having a long axis and a short axis configured to generate a ribbon neutral beam having a beam cross sectional width and a beam cross sectional length at least twice the beam cross sectional width.

18. The apparatus of claim 16, wherein the neutralizer comprising a plurality of mutually parallel neutralizer plates, each neutralizer plate defined by a neutralizer plate height that is at least five times a separation of adjacent neutralizer plates.

19. The apparatus of claim 17 further comprising a substrate stage configured to scan the substrate parallel to the short axis of the one or more elongated apertures.

\* \* \* \* \*